(12) United States Patent
Zen

(10) Patent No.: US 6,758,387 B1
(45) Date of Patent: Jul. 6, 2004

(54) SOLDER COATED MATERIAL AND METHOD FOR ITS MANUFACTURE

(75) Inventor: Mitsuo Zen, Soka (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 09/868,573

(22) PCT Filed: Oct. 20, 1999

(86) PCT No.: PCT/JP99/05777

§ 371 (c)(1),
(2), (4) Date: Aug. 20, 2001

(87) PCT Pub. No.: WO01/28726

PCT Pub. Date: Apr. 26, 2001

(51) Int. Cl.$^7$ .................... B23K 31/02; B23K 35/12; B32B 15/00
(52) U.S. Cl. ............... 228/180.1; 228/254; 228/259; 428/647; 428/935
(58) Field of Search .................. 219/254; 228/254, 228/256, 259, 246, 180.1, 180.22, 110.1; 428/620, 621, 173.6, 647, 935

(56) References Cited

U.S. PATENT DOCUMENTS

| | | | |
|---|---|---|---|
| 3,774,427 A | * 11/1973 | Schreiner et al. ......... | 228/110.1 |
| 3,883,946 A | * 5/1975 | Dale ........................... | 228/121 |
| 4,119,770 A | * 10/1978 | Land ........................... | 429/152 |
| 4,331,258 A | * 5/1982 | Geschwind ................ | 106/14.15 |
| 4,385,976 A | * 5/1983 | Schuster-Wolden et al. ................... | 204/192.29 |
| 4,666,078 A | * 5/1987 | Ohno ......................... | 228/124.1 |
| 4,763,829 A | * 8/1988 | Sherry ....................... | 228/124.1 |
| 4,821,947 A | * 4/1989 | Nowotarski ................ | 228/180.1 |
| 4,906,823 A | * 3/1990 | Kushima et al. ........... | 228/13 |
| 4,978,052 A | * 12/1990 | Fister et al. ................ | 156/325 |
| 5,080,980 A | * 1/1992 | Sakaguchi et al. ......... | 428/610 |
| 5,156,322 A | * 10/1992 | Do-Thoi et al. ........... | 228/124.1 |
| 5,198,964 A | * 3/1993 | Ito et al. .................... | 361/717 |
| 5,232,562 A | * 8/1993 | Elliott ........................ | 204/224 R |
| 5,262,718 A | * 11/1993 | Svendsen et al. .......... | 324/754 |
| RE34,484 E | * 12/1993 | Nagashima et al. ....... | 428/621 |
| 5,322,205 A | * 6/1994 | Kato et al. ................. | 228/110.1 |
| 5,521,432 A | * 5/1996 | Tsuji et al. ................ | 228/13 |
| 5,541,447 A | * 7/1996 | Maejima et al. ........... | 257/669 |
| 5,609,287 A | * 3/1997 | Izuta et al. ................. | 228/123.1 |
| 5,629,559 A | * 5/1997 | Miyahara .................. | 257/666 |
| 6,030,721 A | * 2/2000 | Lake .......................... | 429/124 |
| 6,066,197 A | * 5/2000 | Bristol et al. .............. | 106/14.15 |
| 6,084,775 A | * 7/2000 | Bartley et al. ............. | 361/705 |
| 6,095,404 A | * 8/2000 | McAndrew ................ | 228/180.1 |
| 6,123,248 A | * 9/2000 | Tadauchi et al. .......... | 228/111.5 |
| 6,152,597 A | * 11/2000 | Potega ....................... | 374/185 |
| 6,160,310 A | * 12/2000 | Powell et al. .............. | 257/691 |
| 6,165,819 A | * 12/2000 | Seki et al. .................. | 228/180.1 |
| 6,224,690 B1 | * 5/2001 | Andricacos et al. ....... | 148/400 |
| 6,250,984 B1 | * 6/2001 | Jin et al. .................... | 313/306 |
| 6,316,832 B1 | * 11/2001 | Tsuzuki et al. ............ | 257/747 |
| 6,353,540 B1 | * 3/2002 | Akiba et al. ............... | 361/794 |
| 6,390,353 B1 | * 5/2002 | Lichtenberger ........... | 228/173.1 |
| 6,652,990 B2 | * 11/2003 | Carey et al. ............... | 428/647 |
| 2001/0052643 A1 | * 12/2001 | Sugihara et al. ........... | 257/692 |

FOREIGN PATENT DOCUMENTS

| | | | |
|---|---|---|---|
| DE | 2340423 A | * | 2/1975 |
| JP | 58165211 | | 9/1983 |
| JP | 61165272 | | 7/1986 |
| JP | 63-86254 A | * | 4/1988 |
| JP | 2270990 | | 11/1990 |
| JP | 02-270990 A | * | 11/1990 |
| JP | 761879 | | 3/1995 |
| JP | 9293817 | | 11/1997 |
| JP | 09-293858 A | * | 11/1997 |
| JP | 09-293958 A | * | 11/1997 |
| JP | 9293958 | | 11/1997 |
| JP | 10102283 | | 4/1998 |
| JP | 10-102283 A | * | 4/1998 |
| JP | 11300471 | | 11/1999 |

OTHER PUBLICATIONS

Microfilm of the specification and drawings annexed to the the request of Japanase Utility Model Application No. 112529/1987 (Laid–open No. 18583/1989) (NEC Kansai Ltd.), Jan. 30, 1989.

* cited by examiner

Primary Examiner—L. Edmondson
(74) Attorney, Agent, or Firm—Michael Tobias

(57) ABSTRACT

The present invention is a solder coated material having a large amount of solder adhered to a difficult to solder material such as Kovar or Alloy 42 and a method which can adhere a sufficient amount of solder to a difficult to solder material without using flux. An electroplated coating is applied to a portion to be soldered of a difficult to solder material, the difficult to solder material is then passed through molten solder to which ultrasonic waves are applied, and a large amount of solder is adhered only to solder plated portions.

26 Claims, No Drawings

SOLDER COATED MATERIAL AND METHOD FOR ITS MANUFACTURE

TECHNICAL FIELD

This invention relates to a method for coating a difficult to solder material which makes up an electronic part with solder, and to a coated material which is obtained in this manner and to an electronic part, and particularly to a portion to be soldered of an electronic part.

BACKGROUND ART

At the time of joining lead frames for electronic parts and lids and the like of packaged electronic parts, soldering is carried out. At this time, solder is usually supplied from the outside and soldering is carried out.

In the past, metal materials which have been used in such electronic parts have been metal materials such as copper and copper alloys to which solder readily adheres. However, copper and copper alloys are expensive, and their mechanical strength is not sufficient, so recently, metal materials other than copper and copper alloys have come to be used. Among such metal materials are Kovar (Fe-29Ni-17Co), Alloy 42 (Fe-42Ni), and the like. These metal materials are less expensive than copper and copper alloys and also have superior mechanical properties, but they are much inferior with respect to solderability.

Recently, in the soldering of electronic parts, with the intention of rationalizing soldering, soldering technology has been developed in which solder is not supplied from the exterior each time, but a somewhat excess amount of solder is adhered in advance to a portion to be soldered, and soldering is carried out only with the excess amount of solder which is adhered in advance. Below, this technology will be referred to as the "preplating method".

Electronic parts to which solder is adhered in advance in this manner and in particular portions thereof to be soldered (such as lids and lead frames) include materials in which plate-shaped solder and a difficult to solder material are attached to each other under pressure by rolling (referred to below as solder clad materials), materials to which solder is adhered by immersing a difficult to solder material in molten solder (referred to below as solder coated materials), and the like, which are formed into products by stamping with a press.

In solder clad materials, complete metallurgical bonding does not occur between the plate-shaped solder and the difficult to solder material, so when a solder clad material undergoes stamping with a press to form a part having a desired shape such as a lead frame or a lid, there are cases in which the plate-shaped solder and the difficult to solder material peel from each other, and the difficult to solder material becomes unable to be wet by solder in some locations at the time of soldering.

Furthermore, even with solder coating of a difficult to solder material, it is desirable to adhere an excess amount of solder, but such a sufficient amount of solder can not be provided in advance with certainty. In addition, in this case, there is a problem if too large an amount of solder is adhered.

For example, in the case of a lid of a semiconductor package, if too large an amount of solder is supplied, the excess solder drips off, and it can be the cause of a malfunction of the electronic device housed in the interior. Furthermore, in the case of a lead frame, if there is a large amount of solder, short circuits with adjoining lead wires occur, and in the case of a small electronic part which is sealed after soldering, if there is a large amount of solder, its volume becomes large after sealing, so it is necessary to provide a necessary and sufficient amount of solder in advance with certainty.

Herebelow, this invention will be explained using a solder coated material for a lid as an example.

DISCLOSURE OF THE INVENTION

As already described, difficult to solder metal materials (such as Kovar and Alloy 42, which are referred to below as difficult to solder materials) have recently come to be used even as materials for lids, and it has been found that it is not possible to provide in advance and with certainty a necessary and sufficient amount of solder with respect thereto.

When a solder coated material is obtained by immersing a difficult to solder material in molten solder, it is conceivable to use a highly active flux containing a large amount of a halogen component with respect to a difficult to solder material having poor solderability. However, when performing soldering with a highly active flux, if even a small amount of flux residue remains after soldering, it corrodes the solder and the difficult to solder material, and a corrosion product is produced, which ends up worsening solderability. For this reason, in a solder coating using a flux, after solder is adhered, it was always necessary to perform complete cleaning. A continuous material is advantageous from the standpoint of productivity when manufacturing a solder coated material, and in general a continuous material is used, but in order to perform complete cleaning, it is necessary to use a large cleaning tank and a large amount of cleaning water, and large expenses are necessary for the initial cost of the cleaning tank and the running costs of the water which is used.

From in the past, it has been known that if ultrasonic waves are applied to molten solder and soldering is carried out therein, soldering can be carried out even without a flux. In soldering with ultrasonic waves, the ultrasonic waves peel off oxides and grime adhering to portions to be soldered by means of strong vibrations, and by exposing a clean metal surface, solder can be completely adhered from a metallurgical standpoint.

When ultrasonic waves were employed when applying molten solder plating to a difficult to solder material such as an iron-nickel compound and plating was attempted, in an experiment performed by the present inventors, adequate soldering with respect to a difficult to solder material was not accomplished no matter how strong the ultrasonic waves which were applied.

Accordingly, an object of the present invention is to provide a molten solder plating method which is effective and highly economical with respect to difficult to solder materials.

Another object of the present invention is to provide a solder coated material for use in a portion to be soldered of an electronic part such as a lead frame or a lid for a package and a manufacturing method therefor.

Yet another object of the present invention is to provide a portion to be soldered of an electronic part such as a lead frame or a lid for a package.

A material used in the present invention is a difficult to solder material such as an iron-nickel alloy. It is known that even with such a material, plating can be easily applied by electroplating. However, it is not possible to use a large amount of solder when performing electroplating with solder, and a solder plated material which is obtained by electroplating cannot be used in the preplating method.

The present inventors discovered that if a layer of solder plating on a portion to be soldered of an electronic part has a thickness of 10–50 micrometers, the preplating method can be effectively carried out. Furthermore, they found that even though the amount of solder can not be made this large by electroplating with solder, a difficult to solder material can be easily plated by electroplating, and if a difficult to solder material is first subjected to preplating with a material having good solderability, solder coating to a thickness of 10–50 micrometers can be carried out easily and with certainty by hot dipping.

The present inventors subsequently performed repeated investigations, and they found that by guaranteeing a thickness of 0.5 . 5 micrometers as the thickness of base plating formed by electroplating, at the time of hot dipping, a plating thickness of 10–50 micrometers can be obtained easily and with certainty by carrying out hot dipping using existing equipment and under normal conditions, and they thereby completed the present invention.

Accordingly, the present invention is a solder coated material comprising a substrate comprising a difficult to solder material, an electroplated layer of a material having excellent solderability and a thickness of 0.5–5 micrometers which is provided on the substrate as base plating, and a hot dip solder plated layer having a thickness of 10–50 micrometers which is provided on the electroplated layer.

From a different aspect, the present invention is a manufacturing method for a solder coated material characterized by performing electroplating with a material having excellent solderability on necessary locations of a difficult to solder material, and then passing the difficult to solder material through a molten solder bath while applying ultrasonic waves if necessary and adhering molten solder to the electroplated locations.

In a preferred mode of the present invention, the molten solder bath may be maintained in an inert atmosphere, and the molten solder bath may be a wave soldering bath.

Furthermore, according to a different aspect, the present invention is a portion to be soldered of an electronic part having an electroplated layer of a material having excellent solderability with a thickness of 0.5–5 micrometers applied as base plating atop a substrate comprising a difficult to solder material and a hot dip plated layer of solder with a thickness of 10–50 micrometers applied atop the electroplate.

In the present invention, examples of materials to be soldered which can be used as the substrate include iron-nickel alloys.

Examples of the material having excellent solderability are any of gold, silver, copper, tin, nickel, and solder alloys, but preferably it is a solder alloy of a tin-silver alloy.

Examples of a portion to be soldered of an electronic part are lead frames of electronic parts, lids of packaged electronic parts, battery terminals, shields for modules, and connectors for surface mounted parts.

BEST MODE FOR CARRYING OUT THE INVENTION

When carrying out the present invention, a hoop material of a difficult to solder material such as an iron-nickel alloy (such as Kovar or Alloy 42) is first prepared. Here, a "difficult to solder material" means a material having poor solderability compared to copper or a copper alloy, and specifically it includes iron-nickel alloys such as those mentioned above.

According to this invention, a material having excellent solderability is applied by electroplating to a difficult to solder material like that described above as base plating with a thickness of 0.5–5 micrometers. With electroplating, it is possible to carry out base plating in a relatively short length of time and with certainty of only necessary locations by performing masking of unnecessary locations. Therefore, in the case of a difficult to solder material, the excellent effect is obtained that solder coating can be carried out only on the necessary locations even if hot dip plating is carried out immediately thereafter.

As a material for electroplating the difficult to solder material, any material having excellent solderability can be used. Gold, silver, copper, tin, nickel, solder alloys, and the like can be used as the material having good solderability, but gold and silver are expensive, and copper diffuses into the molten solder during solder coating and forms intermetallic compounds of copper and it may end up changing the composition of the solder coating. The solderability of nickel becomes extremely poor when it is alloyed with iron, but nickel by itself has good solderability. However, it has inferior solderability compared to tin and solder alloys. Accordingly, as a material for electroplating in the present invention, tin and solder alloys are preferred. However, when tin is applied by electroplating as a base layer, if it is left in the atmosphere for a long period of time, its surface ends up oxidizing, so preferably coating with molten solder is promptly carried out after electroplating.

In a coated material according to this invention, if the electroplated layer which is applied as a base layer has a thickness of less than 0.5 micrometers, it is difficult for the molten solder which is applied atop it to adhere, while if it is thicker than 5 micrometers, the time required for electroplating becomes long, leading to an increase in the costs for electricity and a decrease in productivity.

Hot dipping with solder to a thickness of 10–50 micrometers is carried out on a difficult to solder material which was electroplated in this manner to form a base layer.

Namely, the above-described difficult to solder material which was electroplated is continuously immersed in a plating tank containing a molten solder bath, and by adjusting the speed of lifting, i.e., the immersion time, and the temperature, a solder coating of a prescribed thickness can be provided. When applying ultrasonic waves, a prescribed thickness can be obtained by adjusting the length of application, the position, the frequency, and the like.

It is preferable to carry out hot dipping with solder promptly after electroplating, so the hoop material can be continuously supplied without interruption from the electroplating tank to the molten solder hot dipping tank.

If the thickness of the solder layer which is adhered by hot dipping atop the above-described electroplated layer is less than 10 micrometers, the amount of solder at the time of soldering is inadequate, and soldering defects end up occurring. On the other hand, if the thickness is greater than 50 micrometers, not only does the overall thickness end up being non-uniform, but dripping of solder at the time of soldering, short circuits with neighboring portions, and an increase in the volume of small sealed parts occur. Preferably, the thickness is 15–40 micrometers.

In the present invention, the type of solder alloy which is adhered atop the electroplated layer is a Sn—Pb alloy, or is one having Sn—Pb, Sn, or Pb as a main component to which Ag, Sb, Bi, Cu, In, Ni, Ge, P or the like may be suitably added.

According to a preferred mode of the present invention, hot dipping with solder is carried out by applying ultrasonic waves at the time of hot dipping with solder.

In The fluxing action used in soldering (1) removes oxides and grime adhered to a portion to be soldered, (2) promotes wetting and spreading of molten solder, and (3) prevents re-oxidation of a portion to be soldered. Ultrasonic waves have the above-described (1) effect of removing oxides and grime and (2) promoting wetting and spreading, but they do not have (3) the effect of preventing re-oxidation.

Accordingly, if soldering, i.e., solder coating using ultrasonic waves is carried out in the atmosphere, even if solder adheres to the portion to be soldered, the problem develops that oxides adhere to the periphery of the portion to be soldered and solder does not uniformly adhere. In such a case in which oxides adhere to the portion to be soldered, the surface of the molten solder may be covered by an inert atmosphere such as nitrogen or carbon dioxide gas or the like.

A molten solder bath in which the difficult to solder material is immersed may be in a state in which it is not moving at all, i.e., in a still state, but if the molten solder is put into a spouting state in which it is transported under pressure by a pump and jetted from a nozzle, the molten solder can physically promote the removal of surface oxides and grime from the difficult to solder material which was cleaned by ultrasonic waves, and solderability is further improved.

When performing electroplating of a difficult to solder material and performing solder coating in molten solder according to the present invention, the difficult to solder material may be a short material or a continuous material or have any other shape, but if it is made a continuous material, electroplating and coating in the molten solder bath can be carried out continuously, and in addition, at the time of forming a product, it can be continuously formed into a prescribed shape, so productivity is improved.

According to another mode of the present invention, a material having excellent solderability is applied in advance by electroplating only to necessary locations on a difficult to solder material, and then the difficult to solder material is passed through a molten solder bath to which ultrasonic waves are applied, molten solder is adhered only to the locations which were electroplated as described above, and a portion to be soldered of an electronic part such as a lid of a package or a lead frame is formed.

In this manner, according to the present invention, if a solder layer having a thickness of 10–50 micrometers is adhered in advance to a portion to be soldered of an electronic part, not only is the necessity of separately supplying solder at the time of soldering done away with, but there is no formation of bridges in which solder straddles adjoining portions to be soldered, even with minute portions to be soldered.

In the present invention, portions to be soldered of an electronic part to which solder is adhered in advance are lead frames of electronic parts, lids of packaged electronic parts, battery terminals, shields of modules, connectors of surface mounted parts, and other connecting portions for connecting the electronic parts to other parts.

EXAMPLES

In this example, a continuous iron-nickel alloy plate (Kovar) with a width of 10 millimeters and a thickness of 0.1 millimeters was used as a difficult to plate material. Masking was applied to one surface of the iron-nickel alloy plate, and under usual conditions, a 90Sn—Pb alloy solder as base plating was applied to the other surface to a thickness of 2 micrometers to form an electroplated layer. Subsequently, the continuous material of the iron-nickel alloy was passed through molten solder (Pb-4Sn-1Ag-1In-8Bi) in a wave soldering tank to which ultrasonic waves were applied. At this time, the molten solder tank had a bath temperature of 340° C. and was placed in it entirety in an inert atmosphere filled with nitrogen gas. When the difficult to solder material was passed at a speed of 5 meters per minute through the wave soldering tank to which ultrasonic waves were applied, solder coating to a thickness of 30 micrometers was carried out only on the locations where electroplating had been performed. The duration of stay in the solder tank was 2 seconds.

5×5 mm pieces of the solder coated material which was obtained in this manner were punched out with a press, and lids for semiconductor packages were formed. Then, each lid was mounted on a package, and when heated to 310° C. in a nitrogen atmosphere in a reflow furnace without a flux, the package and the lid were completely joined to each other.

5×5 mm pieces of a conventional solder clad material in which a Kovar plate and a plate-shaped piece of the above-described solder alloy were joined under pressure were punched out and lids for semiconductor packages were manufactured. There were many instances in which there was peeling of the Kovar and the plate-shaped solder from each other. When a lid which did not undergo peeling and was thought to be a good product was mounted on a package and heating was carried out in a reflow furnace, a large amount of voids (unsoldered portions) in the joint were produced and there was incomplete joining.

Possibility of Industrial Use

As explained above, a solder coated material according to this invention has solder which is completely and in an amount necessary for joining adhered to a difficult to solder material, so there is no occurrence of soldering defects at the time of soldering. A method of manufacturing a solder coated material according to the present invention can adequately adhere solder, even using the hot dip solder plating method, to a difficult to solder material with respect to which it was conventionally thought to be absolutely impossible to adhere solder without the use of flux. Moreover, the electroplate which is the base plating can be applied to just a prescribed location, such as to one surface or just to both ends of one surface, and molten solder can be also adhered just to desired locations.

Accordingly, when a solder coated material obtained according to this invention is used in a portion to be soldered of an electronic part, the effects are obtained that a highly reliable product is obtained in which not only is soldering completely carried out but in which there is no deterioration in the performance of an electronic part due to solder being adhered to unnecessary locations during soldering or damage to the visual appearance.

What is claimed is:

1. A manufacturing method for a solder coated material comprising electroplating a difficult to solder material with a material having excellent solderability to form an electroplated layer, and then passing the difficult to solder material through a molten solder bath to form a hot dip solder plating layer having a thickness of 10–50 micrometers on the electroplated layer.

2. A manufacturing method for a solder coated material as claimed in claim 1 including applying ultrasonic waves to the molten solder bath.

3. A manufacturing method for a solder coated material as claimed in claim 1 wherein the difficult to solder material is an iron-nickel alloy.

4. A manufacturing method for a solder coated material as claimed in claim 1 wherein the material having excellent solderability is selected from gold, silver, copper, tin, nickel, and solder alloys.

5. A manufacturing method for a solder coated material as claimed in claim 1 wherein the molten solder bath is maintained in an inert atmosphere.

6. A manufacturing method for a solder coated material as claimed in claim 1 wherein the molten solder bath in the molten solder is a wave soldering bath.

7. A battery terminal comprising a substrate comprising a difficult to solder material, an electroplated layer of a material having excellent solderability and having a thickness of 0.5–5 micrometers applied as base plating atop the substrate, and a hot dip solder plating layer with a thickness of 10–50 micrometers applied atop the electroplated layer.

8. A shield of a module comprising a substrate comprising a difficult to solder material, an electroplated layer of a material having excellent solderability and having a thickness of 0.5–5 micrometers applied as base plating atop the substrate, and a hot dip solder plating layer with a thickness of 10–50 micrometers applied atop the electroplated layer.

9. A method as claimed in claim 1 wherein the difficult to solder material forms part of a lead frame for an electronic part.

10. A method as claimed in claim 1 wherein the difficult to solder material forms part of a lid of a packaged electronic part.

11. A method as claimed in claim 1 wherein the difficult to solder material forms part of a battery terminal.

12. A method as claimed in claim 1 wherein the difficult to solder material forms a part of a shield of a module.

13. A method as claimed in claim 1 wherein the difficult to solder material forms part of a connector for a surface mounted part.

14. A method as claimed in claim 1 wherein the hot dip solder plating layer has a thickness of 15–40 micrometers.

15. A method of forming a packaged electronic part comprising performing reflow soldering of a lid including a substrate of a difficult to solder material, an electroplated layer of a material having excellent solderability formed on the substrate as base plating, and a hot dip solder plating layer formed on the electroplated layer to a package to join the lid to the package.

16. A method as claimed in claim 15 wherein the electroplated layer has a thickness of 0.5–5 micrometers and the hot dip solder plating layer has a thickness of 10–50 micrometers.

17. A method as claimed in claim 10 wherein the hot dip solder plating layer has a thickness of 15–40 micrometers, and the electroplated layer and the hot dip solder plating layer are formed on one but not both of a top and a bottom side of the lid.

18. A method as claimed in claim 10 wherein the difficult to solder material is an iron-nickel alloy, and the electroplated layer and the hot dip solder plating layer are formed on one but not both of a top and a bottom side of the lid.

19. A method as claimed in claim 16 wherein the hot dip solder plating layer has a thickness of 15–40 micrometers, and the electroplated layer and the hot dip solder plating layer are formed on one but not both of a top and a bottom side of the lid.

20. A method as claimed in claim 16 wherein the difficult to solder material is an iron-nickel alloy, and the electroplated layer and the hot dip solder plating layer are formed on one but not both of a top and a bottom side of the lid.

21. A method as claimed in claim 1 wherein the difficult to solder material comprises a continuous plate, the method including:

forming the electroplated layer and the hot dip solder plating layer on one but not both of a top and a bottom side of the continuous plate; and punching the continuous plate after forming the hot dip solder plating layer to obtain preplated parts.

22. A method as claimed in claim 21 including punching the plate to form preplated lids for semiconductor packages.

23. A method as claimed in claim 21 wherein the hot dip solder plating layer has a thickness of 15–40 micrometers.

24. A method as claimed in claim 21 wherein the plate comprises an iron-nickel alloy.

25. A lid of a packaged electronic part comprising a substrate comprising a difficult to solder material, an electroplated layer of a material having excellent solderability and having a thickness of 0.5–5 micrometers applied as base plating atop the substrate, and a hot dip solder plating layer with a thickness of 15–40 micrometers applied atop the electroplated layer, the electroplated layer and the hot dip solder plating layer being formed on one but not both of a top and a bottom side of the lid.

26. A lid as claimed in claim 25 wherein the substrate is an iron-nickel alloy.

* * * * *